United States Patent
Strachan et al.

(10) Patent No.: US 7,425,741 B1
(45) Date of Patent: Sep. 16, 2008

(54) EEPROM STRUCTURE WITH IMPROVED DATA RETENTION UTILIZING BIASED METAL PLATE AND CONDUCTIVE LAYER EXCLUSION

(75) Inventors: Andrew Strachan, Santa Clara, CA (US); Natalia Lavrovskaya, Sunnyvale, CA (US); Saurabh Desai, Fremont, CA (US); Roozbeh Parsa, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/186,442

(22) Filed: Jul. 21, 2005

Related U.S. Application Data

(60) Provisional application No. 60/690,288, filed on Jun. 14, 2005.

(51) Int. Cl.
*H01L 29/788* (2006.01)

(52) U.S. Cl. .................... 257/315; 257/316; 257/E29.3
(58) Field of Classification Search ......... 257/314–316, 257/324, 326, E29.3, E29.309; 438/261
See application file for complete search history.

(56) References Cited

U.S. PATENT DOCUMENTS

| | | | |
|---|---|---|---|
| 4,698,787 A | 10/1987 | Mukherjee et al. | 365/185 |
| 5,086,410 A | 2/1992 | Bergemont et al. | |
| 5,614,748 A * | 3/1997 | Nakajima et al. | 257/316 |
| 6,137,723 A | 10/2000 | Bergemont et al. | 365/185.18 |
| 6,597,036 B1 * | 7/2003 | Lee et al. | 257/316 |
| 2003/0043630 A1 * | 3/2003 | Forbes et al. | 365/185.26 |

* cited by examiner

*Primary Examiner*—Matthew C Landau
(74) *Attorney, Agent, or Firm*—Stallman & Pollock LLP

(57) ABSTRACT

A biased conductive plate is provided over an NVM cell structure to overcome data retention charge loss due to the presence of dielectric films that are conductive at higher temperatures. The biased conductive plate is preferably formed from the lowest metal layer in the fabrication process flow, but any biased conductive layer can be used.

9 Claims, 5 Drawing Sheets

EEPROM STRUCTURE WITH IMPROVED DATA RETENTION UTILIZING BIASED METAL PLATE AND CONDUCTIVE LAYER EXCLUSION

RELATED APPLICATION

This application claims the benefit of U.S. Provisional Patent Application No. 60/690,288, file on Jun. 14, 2005, titled "EEPROM Structure With Improved Data Retention Utilizing Biased Metal Plate And Conductive Layer Exclusion." Provisional Patent Application No. 60/690,288 is hereby incorporated by reference in its entirety.

TECHNICAL FIELD

The present invention relates to a methodology for improving the retention properties of a non-volatile memory (NVM) cell by utilizing a biased metal plate and conductive layer exclusion to protect against charge redistribution in the layers surrounding an NVM cell's floating gate.

DESCRIPTION OF THE INVENTION

Figure 1:
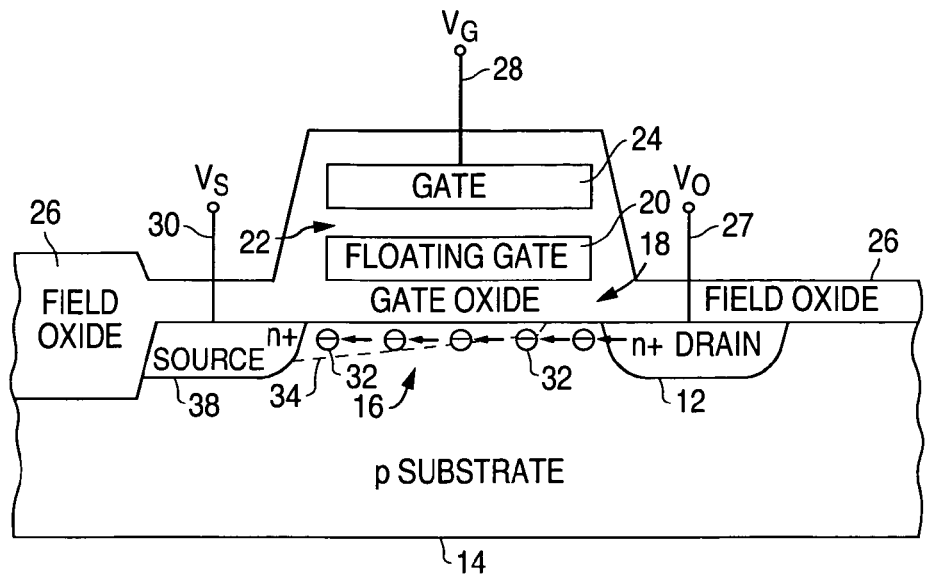
FIG. 1 is a partial cross section drawing illustrating a conventional electrically programmable read only memory (EPROM) cell structure.

Single poly EEPROM devices are used in analog technologies to provide an electrically programmable and erasable method of storing information in a non-volatile manner. The EEPROM cell works by being programmed into an "on" state by application of a large negative voltage pulse to the drain node. The "on" state is achieved by injecting electrons (charge) into the floating gate of the EEPROM. An EEPROM cell is erased by applying a large negative voltage pulse to the control gate of the device's PMOS storage transistor. Cells in an EEPROM array can be selectively programmed or erased according to the user's requirements. The key property of the cell is the ability to store charge on the floating gate and to later be able to read back the state of the gate as charged or uncharged.

U.S. Pat. No. 4,698,787, issued on Oct. 6, 1987, discloses as prior art the conventional electrically programmable read only memory (EPROM) device structure shown in FIG. 1. The FIG. 1 EPROM transistor device includes a source 10 and a drain 12 formed on a substrate 14. The source 10 and the drain 12 define a channel 16 in the substrate 14. Positioned above the channel 16 is a layer of insulating material that forms a gate dielectric layer 18. A floating gate 20 of semiconductor material is formed over the gate dielectric layer 18. A second layer 22 of insulating material is formed over the floating gate 20. Finally, a layer of semiconductor material is formed over the second layer of insulating material 22 to form a control gate 24. Field oxide 26 isolates the transistor structure from periphery devices. Electrical connections 26, 28 and 30 are provided for applying voltages to the drain 12, gate 24, and source 10, respectively.

Programming of the FIG. 1 EPROM cell is accomplished by raising the potential of the drain 12 (e.g. 8-12V), holding the source 10 at ground and applying a programming voltage pulse (e.g., approximately 13-21V) to the control gate 24 for a preselected period of time (e.g., 1-10 milliseconds). The result of these conditions is that a conductive region is established in the channel 16 across which electrons 32 are accelerated. The conductive region is designated by the dashed line 34 in FIG. 1. The magnitude and polarity of the voltages applied to the drain 12, the source 10 and the gate 24 are such that this conductive region is "pinched off" in a region adjacent to the drain 12. This causes electrons 32 to be raised sufficiently in potential so that they become "hot." These "hot" electrons create additional electron/hole pairs by impact ionization. In this condition, these electrons are elevated to an energy level that permits them to overcome the insulating properties of the gate dielectric 18. The hot electrons can thus "jump" the potential barrier of the gate dielectric 18. Due to the electric field created by the control gate, the hot electrons are attracted to the floating gate 20 where they are stored, thereby programming the cell.

Figure 2:
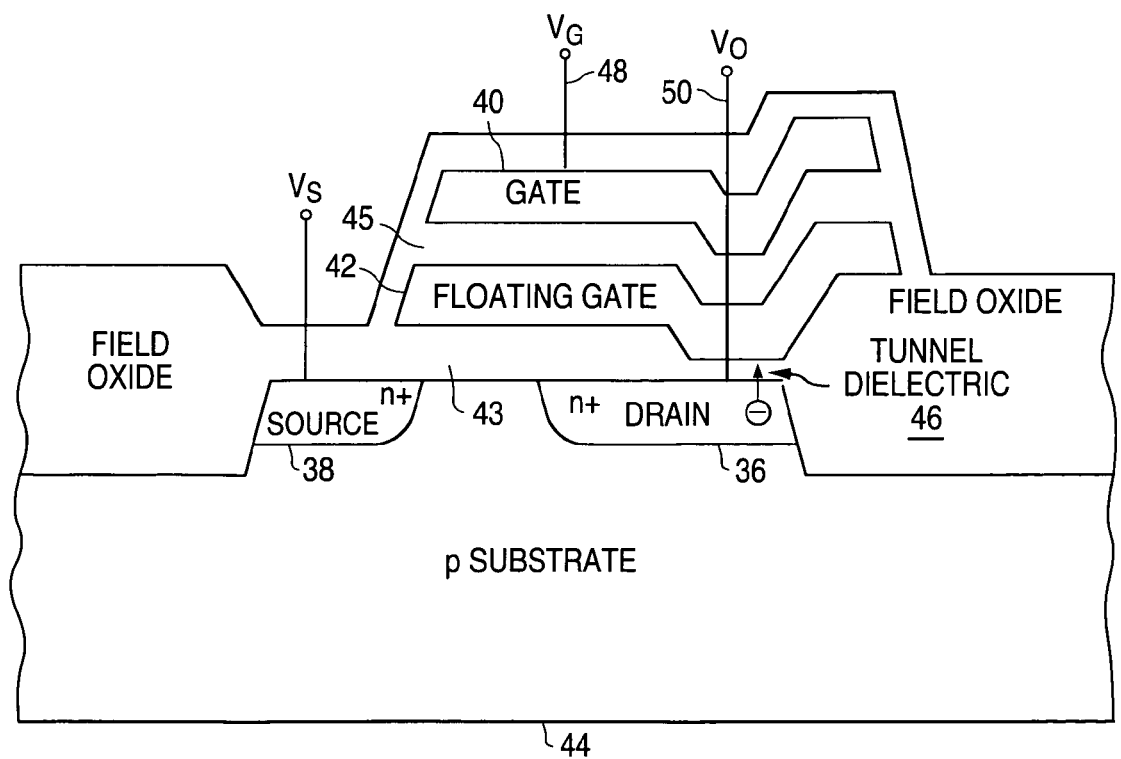
FIG. 2 is a partial cross section drawing illustrating a conventional electrically erasable programmable read only memory (EEPROM) cell structure.

The above-cited '787 patent also discloses a programming mechanism for an electrically erasable programmable read only memory (EEPROM), shown in FIG. 2. The EEPROM cell structure shown in FIG. 2 utilizes a different programming mechanism than does the EPROM cell described above. As with the EPROM structure, the EEPROM structure includes a drain 36, a source 38, a floating gate 32 separated from the substrate by a gate oxide layer 43, a gate 40 separated from the floating gate 32 by another layer of oxide 45, all of which are deposited or thermally grown. However, the EEPROM structure differs from the EPROM structure in that it provides a thin tunnel dielectric 46 between the drain 36 and the floating gate 42. As shown in FIG. 2, the portion of the floating gate that is positioned above the tunnel dielectric 46 is positioned on the drain region 36. Further, the portion of the gate 40 that is aligned with the tunnel dielectric 46 is also positioned on the drain 36. Programming (and erasing) of this structure is achieved by inducing potential differences between the gate 48 and drain 50 that are on the order of 20V. The thin dielectric region coupled with the high voltage between the gate 48 and the drain 50 induces "Fowler-Nordheim tunneling."

To program the FIG. 2 cell, i.e. to place electrons on the floating gate 42, the drain region 50 is held at ground potential while the gate 48 is pulsed for approximately 10 milliseconds at a potential of approximately 20V. During the programming operation, the source region 38 is allowed to float. Under these conditions, electrons tunnel through the tunnel dielectric 46 to the floating gate 42.

Figure 3A:
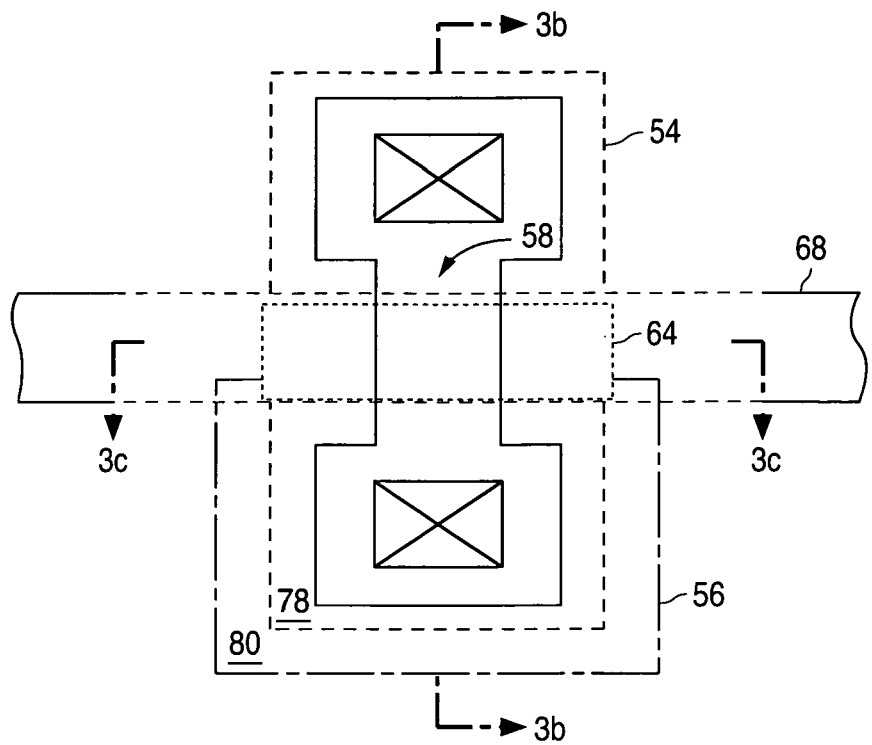
FIGS. 3a and 3b are, respectively, a plan view and a partial cross section drawing illustrating an alternate embodiment of a conventional EEPROM cell.
Figure 3B:
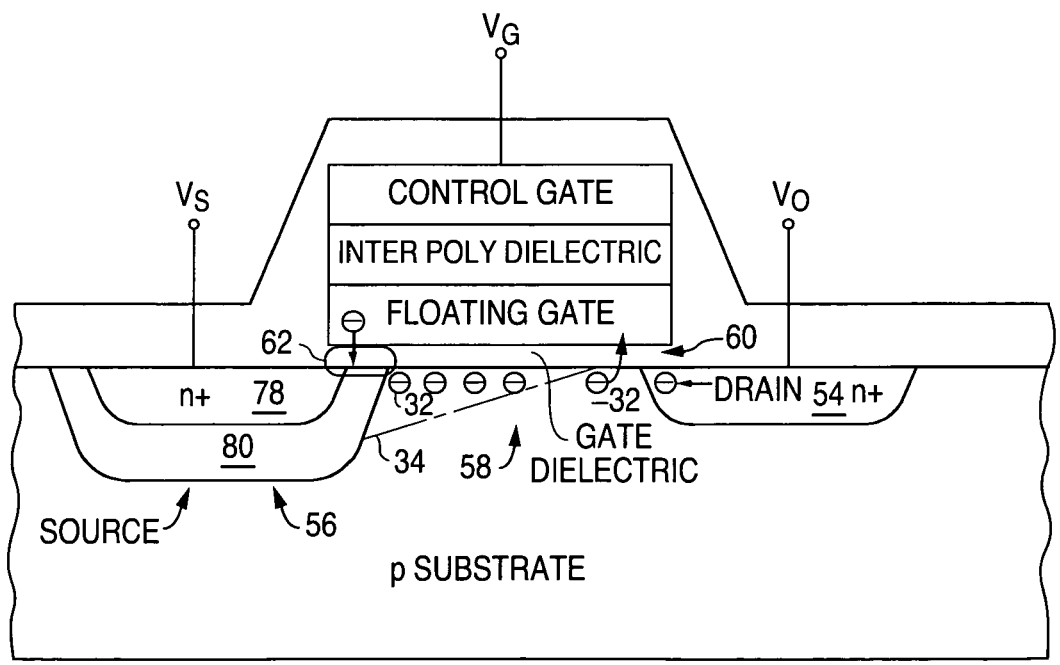

The '787 patent also discloses another EEPROM cell structure, shown in FIGS. 3*a* and 3*b*. In this structure, a relatively shallow drain region 54 and a deeper source region 56 are formed in a silicon substrate 52. A channel 58 is defined between the source 56 and the drain 54. A gate dielectric 60 is formed over the channel 58 and extends over the channel 58 and to extend between the drain 54 and to overlap a portion 62 of the source 56. The gate dielectric 60 has a relatively uniform thickness over its entire cross section. A floating gate 64 is formed over the gate dielectric 60. A second layer of dielectric material 66 is formed over the floating gate 64. A control gate 68 is formed over the second layer of insulating material 66.

Programming of the cell shown in FIGS. 3*a* and 3*b* is achieved by raising the drain region 54 and the control gate 68 to predetermined potentials above that of the source region 56. For example, in one programming scheme, the drain 54 is raised to between 4-6V, while the control gate 68 is pulsed at about 10-12V for approximately 0.5-5 msec. Under these conditions, "hot" electrons are generated and accelerated across the gate dielectric and onto the floating gate. Thus, the programming operation for this cell is similar to that of a conventional EPROM cell.

U.S. Pat. No. 6,137,723, issued on Oct. 24, 2000, discloses a so-called "Frohmann-Bentchkowsky" memory transistor, shown in FIG. 4. The FIG. 4 device includes spaced-apart p-type source region 70 and drain region 72 formed in an n-well 74, which in turn is formed in a p-type silicon substrate 76. A channel region 78 is defined between the source region 70 and the drain region 72 and a layer of gate oxide 80 is formed over the channel region 78. A gate 82 is formed over the gate oxide layer 80. A layer of insulating material 84 along with gate oxide 80 encapsulates the floating gate 82.

Figure 4:
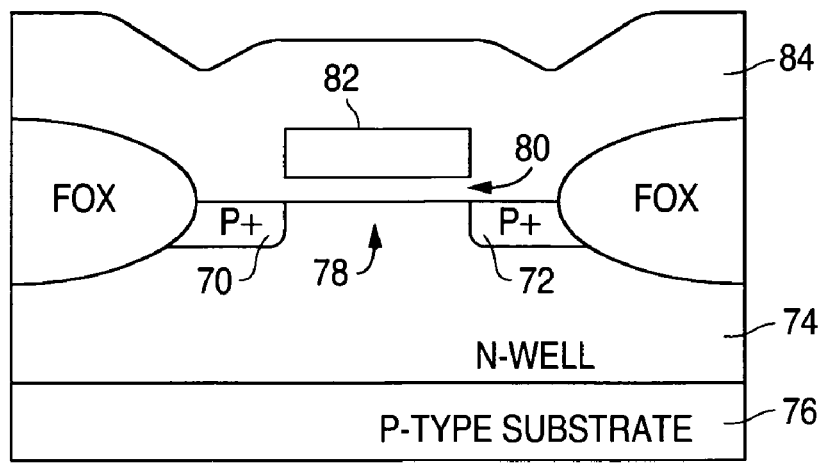
FIG. 4 is a partial cross sectioning drawing illustrating a conventional Frohmann-Bentchkowsky EPROM cell.

The FIG. 4 cell is programmed by applying biasing voltages to the well 74 and to the drain region 72 that are sufficient to induce avalanche breakdown. For example, avalanche breakdown is induced by applying ground to the well 74 and a negative breakdown voltage to the drain 72, while either grounding or floating the source region 70, or by applying a positive breakdown voltage to the well 74 and ground to the drain 72, while floating or applying the positive breakdown voltage to the source 70. The biasing voltages that are sufficient to induce avalanche breakdown establish a strong electric field across the drain-to-well junction depletion region. The strong electric field accelerates electrons in the junction depletion region into substrate hot electrons. A number of these substrate hot electrons penetrate the gate oxide layer 80 and accumulate on the floating gate 82, thereby programming the cell.

Each of the cells described above is exemplary of a programming scheme for a non-volatile memory (NVM) cell. As mentioned above, one of the basic properties of NVM cells is the ability to maintain charge on the floating gate within a required period of time (retention). Over time and at high temperature in an unbiased state, the charge stored on the floating gate of an NVM cell is lost. This leads to an inability to distinguish between charged and uncharged cells.

Figure 5:
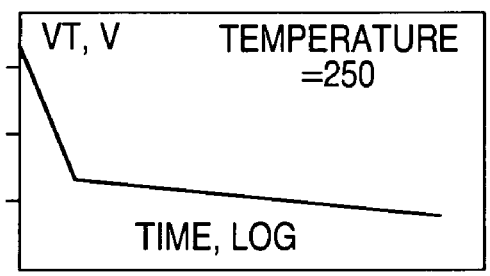
FIG. 5 is a plot presenting typical dependence of VT vs. time for a programmed non-volatile memory (NVM) cell.

A method to characterize the retention of gate charge in an NVM cell is to monitor the threshold voltage VT of the cell over time. A typical dependence of VT versus time is presented in FIG. 5. The FIG. 5 plot shows two mechanisms in effect with different characteristics that are commonly attributed to two leakage mechanisms: an initial leakage mechanism that leads to a significant VT shift within a short time (seconds or minutes) followed by a more gradual decrease in VT over a much longer period of time (e.g. 10 years).

It has been determined that, in the class of deep submicron EEPROM devices, data retention is limited due to the presence of various layers above the floating polysilicon gate. Although typically considered as insulating dielectrics, some of the materials used in these layers, for example SiON, are conductive at both room and higher temperatures. This means that charge from the floating gate is lost over time when these layers touch the floating gate.

A number of alternate structural solutions to this problem are discussed below. Globally removing the SiON layer is not an option because it is an integral part of any deep submicron CMOS process with self-aligned contacts. One solution is to use a thick oxide layer between the poly gate and the SiON, varying the thickness and composition of this oxide layer to optimize the application. Typically, the SiON layer will be about 200-1000 Å thick. Those skilled in the art will appreciate that the effectiveness of the solution is improved with increased thickness, up to a certain point. However, the complexity of processing also increases with thickness. Thus, the best solution is the thinnest film that provides an acceptable level of retention. Another solution is to selectively remove the SiON over the NVM device. This can be done at zero cost if there is a photoalignment mask required at the SiON step. All of these solutions are improved, however, by utilizing a biased metal plate over the EEPROM cell. The metal plate should be formed in the lowest possible layer of the cell structure. For lowest cost, the plate should preferably be made from an existing metal layer (e.g. M1). However, any conductive material could be substituted for the metal.

Metal shields are routinely used in EEPROMs for UV protection and shielding. In these applications, however, the metal shields are either floating or connected to ground. To improve data retention in accordance with the concepts of the present invention, the metal plate formed over the cell structure should be biased during each of the read, programming and erasing operations. While the plate biasing conditions may vary from operation to operation, the preference is a constant biasing voltage that is the same for all operations. This voltage will depend upon the kind of charge from which the floating gate (FG) should be protected, and where the source of the charge is located. For example, a negative metal plate voltage can be utilized to attract positive ions located between the floating (FG) and the plate. Thus, the improvement in charge retention results from the electrical interaction of the metal plate with charges close to but not inside the floating gate. This is in contrast to the conventional purely masking effect where bias on the metal plate is unimportant.

Figure 6:
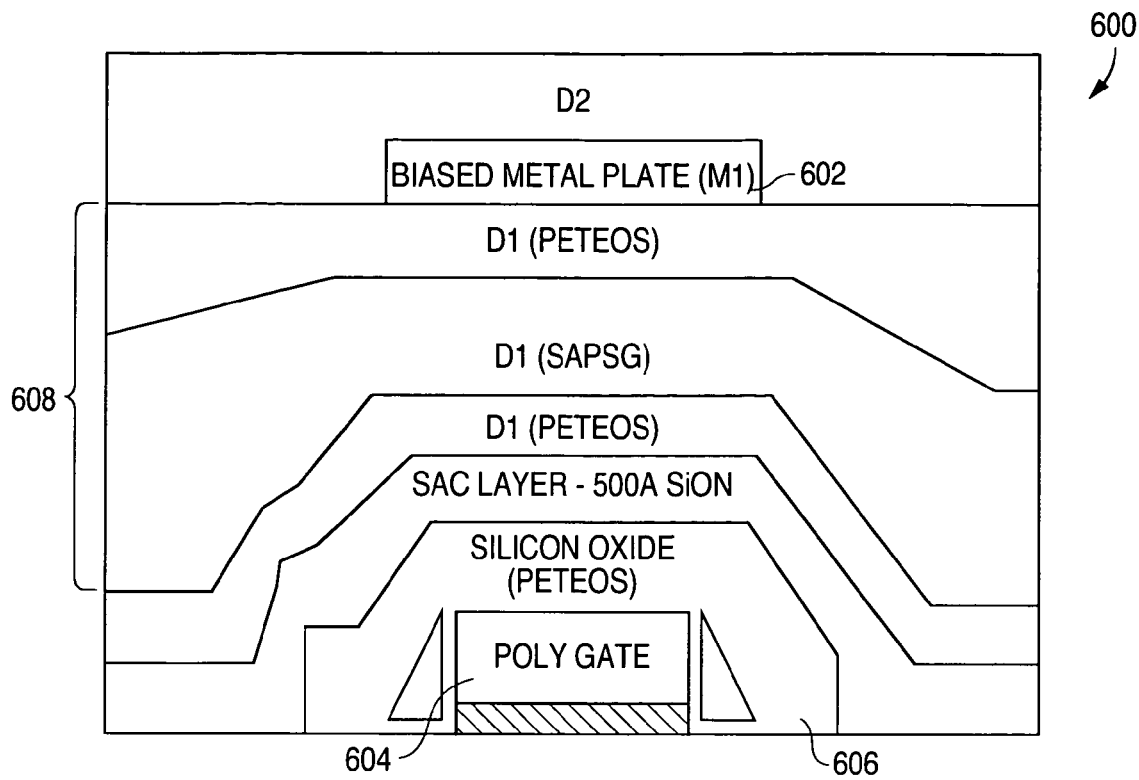
FIG. 6 is a partial cross-section drawing illustrating an embodiment of an NVM cell structure utilizing a biased metal plate in accordance with the concepts of the present invention.

FIG. 6 shows an embodiment of the invention wherein an NVM cell 600 includes a biased metal plate 602 formed from the first metal layer (M1), typically aluminum or copper, over the poly floating gate 604 and with thicker than normal plasma enhanced silicided oxide (PETEOS) 606 formed on the gate 604. A second layer 608 of dielectric material is formed over the silicided oxide layer 606. In the FIG. 6 embodiment of the invention, the second layer 608 of dielectric material comprises a layer of silicon nitride (SiON) about 200-1000 Å thick formed on the silicided oxide layer 606, a layer of plasma enhanced TEOS formed on the SiON layer, a layer of sub-atmospheric phosphosilicate glass (SAPSG) formed on the PETEOS layer, and a second PETEOS layer.

Figure 7:
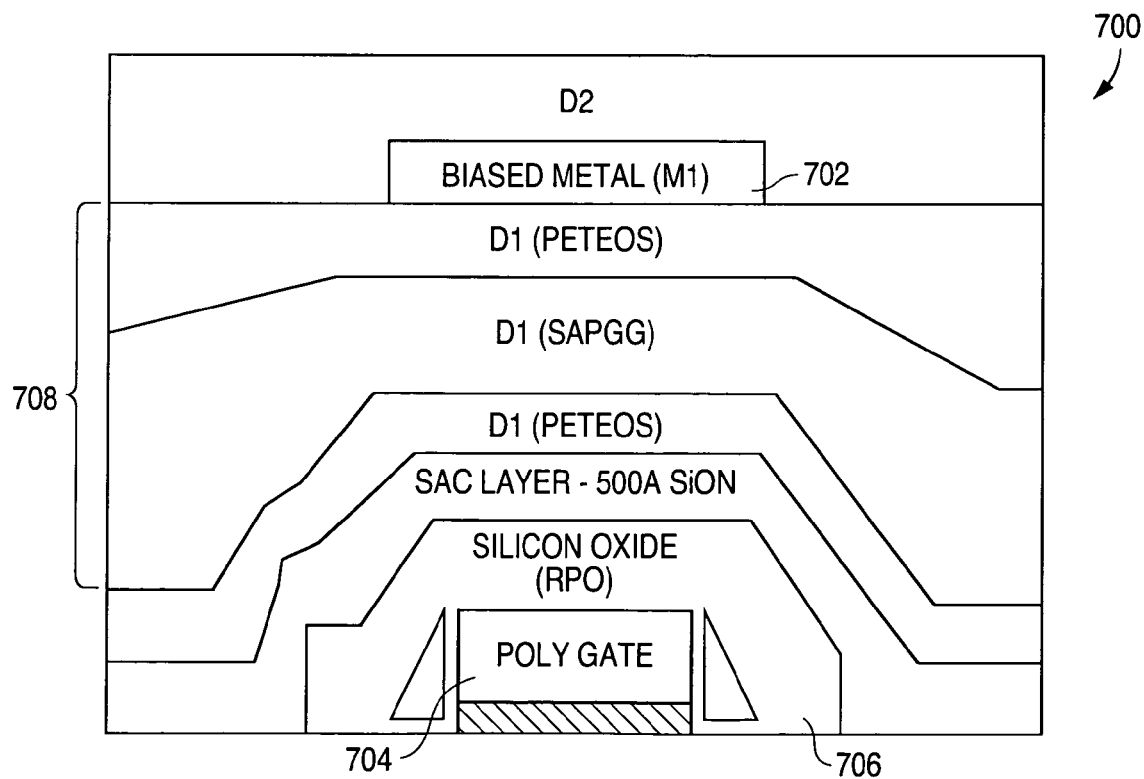
FIG. 7 is a partial cross section drawing illustrating an alternate embodiment of an NVM cell structure utilizing a biased metal plate in accordance with the concepts of the present invention.

FIG. 7 shows an alternate embodiment of the invention wherein an NVM cell 700 includes a biased metal plate 702 formed from the first metal layer (M1) over the poly floating gate 704 and with thicker than normal silicide oxide (RPO) 706 formed on the gate 704. As in the FIG. 6 structure, a 200-1000 Å SiON layer and a second layer 708 of dielectric material are formed over the resistor protect oxide (RPO) layer.

Figure 8:
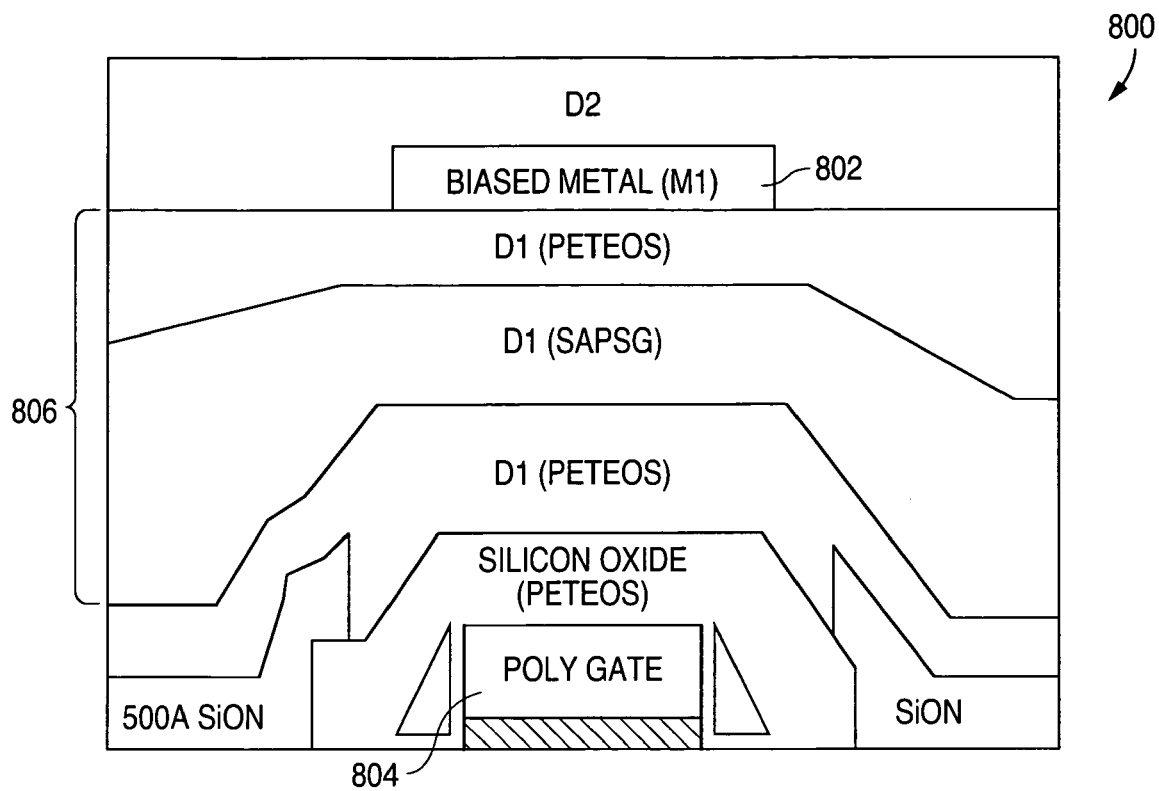
FIG. 8 is a partial cross section drawing illustrating a second alternate embodiment of an NVM cell structure utilizing a biased metal plate in accordance with the concepts of the present invention.
Figure 9:
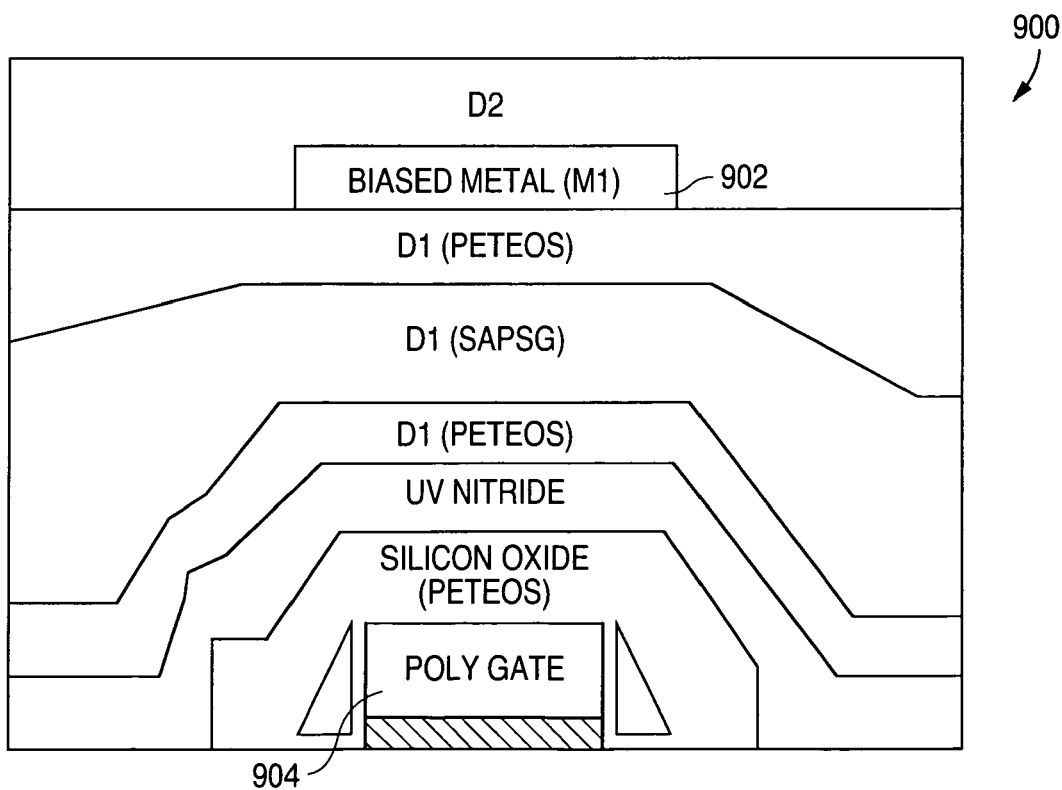
FIG. 9 is a partial cross section drawing illustrating a second alternate embodiment of an NVM cell structure utilizing a biased metal plate in accordance with the concepts of the present invention.

FIG. 8 shows a second alternate embodiment of the invention wherein an NVM cell 800 includes a biased metal plate 802 formed from the first metal layer (M1) over the poly floating gate 804 with removal of a portion of the SiON layer to form an opening in the SiON layer above the floating poly gate 804. A second dielectric layer 802 includes sequentially formed layers of silicided oxide (PETEOS), PETEOS, SAPSG, and PETEOS FIG. 9 shows a third alternate embodiment of the invention wherein an NVM cell 900 includes a biased metal plate 902 formed from the first metal layer (M1) formed over the poly floating gate 904 and with the sacrificial (SAC) layer formed from UV nitride 906, rather than from SiON as in the FIGS. 6-8 embodiments. UV nitride has a much lower conductivity than SiON, but has similar chemical properties to provide an etch stop for contact etch in a similar manner to SiON.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A non-volatile memory (NVM) cell structure formed in a semiconductor substrate and adapted for performing NVM cell operations including program and erase operations, the NVM cell structure comprising:

an MOS storage transistor that includes a conductive floating gate formed over an upper surface of the semiconductor substrate and separated therefrom by intervening gate dielectric material;

a second layer of dielectric formed over the conductive floating gate, the second layer of dielectric material comprising a layer of silicon oxide formed on an upper surface of the conductive floating gate, a layer of silicon nitride formed on the layer of silicon oxide, a first layer of PETEOS formed on the layer of silicon nitride, a layer of SAPSG formed on the first layer of PETEOS, and a second layer of PETEOS formed on the layer of SAPSG; and a conductive shield plate formed over the second layer of dielectric material and over the conductive floating gate, the conductive shield plate adapted to receive a biasing signal during the performance of the NVM cell operations.

2. An NVM cell structure as in claim 1, and wherein the conductive floating gate comprises polysilicon.

3. An NVM cell structure as in claim 2, and wherein the conductive shield plate comprises a metal.

4. An NVM cell structure as in claim 3, and wherein the metal comprises aluminum.

5. An NVM cell structure as in claim 1, and wherein the layer of silicon oxide comprises PETEOS.

6. An NVM cell structure as in claim 1, and wherein the layer of silicon oxide comprises RPO.

7. An NVM cell structure as in claim 1, and wherein the layer of silicon nitride is about 200-1000 Å thick.

8. An NVM structure as in claim 1, and wherein the layer of silicon nitride comprises UV nitride.

9. An NVM cell structure as in claim 1, and wherein the biasing signal applied to the conductive shield plate during cell operations is a constant biasing signal.

\* \* \* \* \*